United States Patent
Guiramand

(10) Patent No.: US 7,821,302 B2
(45) Date of Patent: Oct. 26, 2010

(54) FREQUENCY MONITOR

(75) Inventor: Jean-Francois Guiramand, Bouc Bel Air (FR)

(73) Assignee: Atmel Rousset S.A.S., Rousset Cedex (FR)

( * ) Notice: Subject to any disclaimer, the term of this patent is extended or adjusted under 35 U.S.C. 154(b) by 439 days.

(21) Appl. No.: 11/753,423

(22) Filed: May 24, 2007

(65) Prior Publication Data
US 2008/0290904 A1    Nov. 27, 2008

(51) Int. Cl.
*G01R 23/02* (2006.01)
*H03D 3/00* (2006.01)
*H03K 9/06* (2006.01)

(52) U.S. Cl. .............................. 327/47; 327/46; 327/48
(58) Field of Classification Search .............. 327/46–49
See application file for complete search history.

(56) References Cited

U.S. PATENT DOCUMENTS

| | | | |
|---|---|---|---|
| 4,090,090 A | 5/1978 | Johnston | |
| 4,231,029 A | 10/1980 | Johnston | |
| 4,442,406 A | 4/1984 | Voss | |
| 4,694,263 A | 9/1987 | Cross | |
| 5,469,148 A | 11/1995 | Baumann et al. | |
| 5,497,110 A * | 3/1996 | Smith | 327/42 |
| 5,610,594 A | 3/1997 | Baumann et al. | |
| 6,597,204 B2 * | 7/2003 | Imamura | 327/20 |
| 6,597,749 B1 * | 7/2003 | Bracmard | 375/342 |
| 7,046,964 B1 * | 5/2006 | Sullivan et al. | 455/67.11 |
| 2006/0132190 A1 | 6/2006 | Driediger et al. | |

* cited by examiner

*Primary Examiner*—Lincoln Donovan
*Assistant Examiner*—Adam D Houston
(74) *Attorney, Agent, or Firm*—Schwegman, Lundberg & Woessner, P.A.

(57) ABSTRACT

A method and system for monitoring a frequency of a clock signal is disclosed. The method and system comprise dividing a clock signal into a plurality of clock signal components. The method and system further comprise adding a delay to each of the clock signal components and comparing the plurality of signal components with each of the delayed clock signal components to monitor whether the clock signal is within a predetermined frequency range. The method and system includes providing an output signal indicative of a condition of the clock signal based upon the comparing step.

18 Claims, 14 Drawing Sheets

3 - Functional Diagram:
  a) Basic Timescale Diagram:

FREQUENCY MONITOR

FIELD OF THE INVENTION

The present invention relates generally to integrated circuits and more specifically to determining that the clock frequency of an integrated circuit is not within reference frequency.

BACKGROUND OF THE INVENTION

Integrated circuits utilize clock signals for a variety of purposes. It is important that the clock signal be within a specified frequency range during operation of the circuit. Typically the clock signal will operate within a specified reference frequency range or within specification if the clock signal is outside of the range an error signal will be generated. It is desirable that a system be in place to monitor the frequency of the clock signal to provide an indication of whether the clock signal is within the specified range. Accordingly, what is needed is a system and method that provides good results in behavior and security performance, good behavior at high frequencies, low and very low frequencies (to avoid for example step by step working), and is insensitive to the input clock duty cycle. In addition, it is desired that the method and system has low power consumption, and provides a simpler and more effective solution for determining whether an input clock signal is within specification. The present invention addresses such a need.

SUMMARY OF THE INVENTION

A method and system for monitoring a frequency of a clock signal is disclosed. The method and system comprise dividing a clock signal into a plurality of clock signal components. The method and system further comprise adding a delay to each of the clock signal components and comparing the plurality of signal components with each of the delayed clock signal components to monitor whether the clock signal is within a predetermined frequency range. The method and system includes providing an output signal indicative of a condition of the clock signal based upon the comparing step.

DETAILED DESCRIPTION

The present invention relates generally to integrated circuits and more specifically to determining that the clock frequency of an integrated circuit is not within reference frequency. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
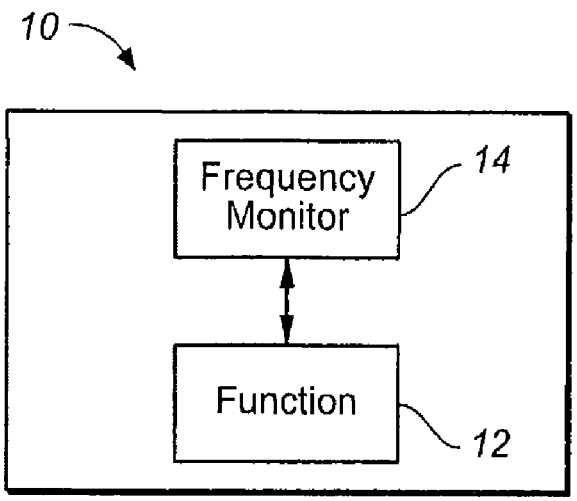
FIG. 1 is a block diagram of an integrated circuit.

FIG. 1 is a block diagram of an integrated circuit 10. The integrated circuit 10 could be, for example, a digital signal processor, a microcontroller or a variety of other devices that are part of an electronic device. Accordingly, typically the integrated circuit has one or more functional units 12 located therewithin. In addition, it is generally desirable to provide a frequency monitor 14 to provide an indication of the frequency of a clock signal on the functional unit 12 within the circuit 10.

Figure 1A:
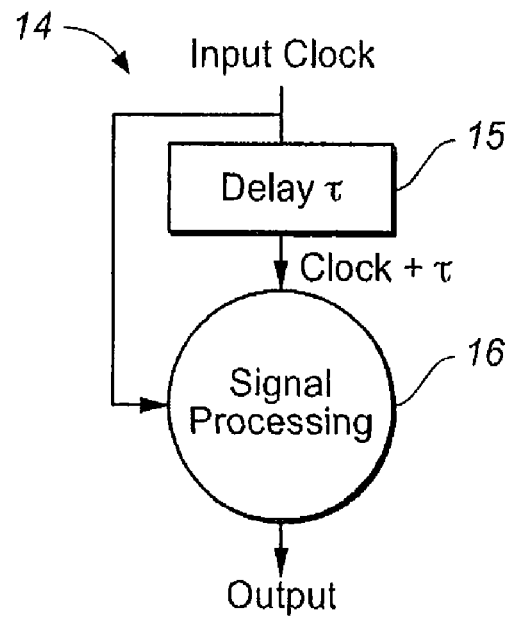
FIG. 1A illustrates a simple block diagram of a frequency monitoring circuit in accordance with the present invention.

FIG. 1A illustrates a simple block diagram of the frequency monitoring circuit 14 in accordance with the present invention. As is seen, an input clock signal is delayed by delay element 15 to provide a reference signal (clock+τ(delay)). The reference signal and the input clock signal are provided to a signal processing unit 16. The signal processing unit 16 then processes the input signal and the reference signal to provide an output signal indicative of the condition of the clock signal. What is meant by the condition of a signal is whether the signal is inside or outside of the specified frequency range.

Figure 2A:
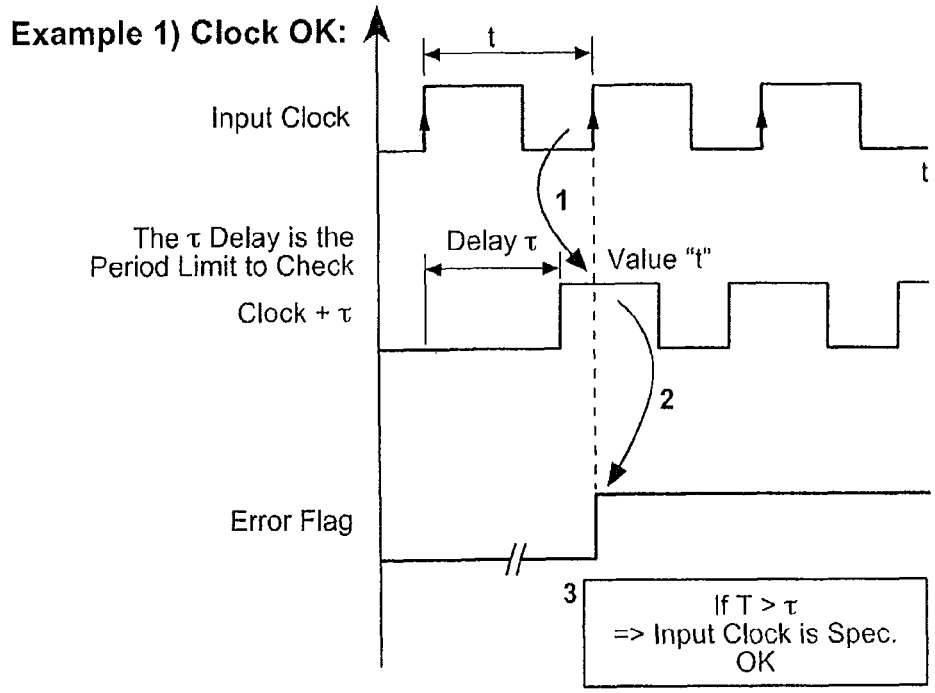
FIG. 2A shows an example where the clock signal is within the specified range.

FIG. 2A shows an example where the clock signal is within the specified frequency range. As is seen, when the period of the input signal (T) is greater than the delay (τ) the input clock is within the specified frequency. In this embodiment as is seen if the delay is active during the rising edge of input clock, the output clock is within specification.

Figure 2B:
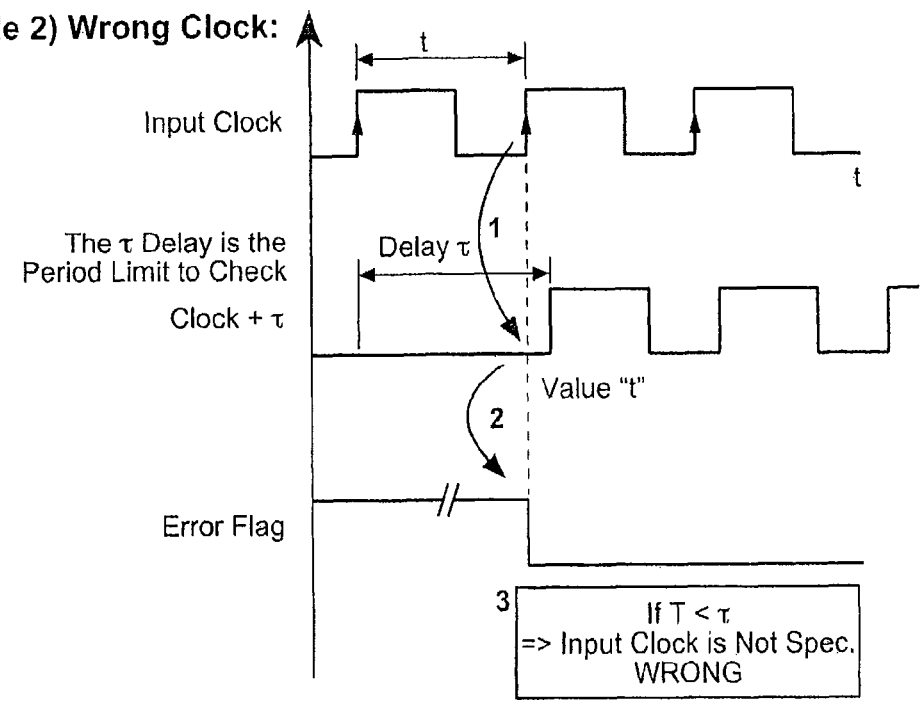
FIG. 2B shows an example when the input clock is not within the frequency range.

FIG. 2B shows an example when the input clock is not within the frequency range. As is seen the clock frequency is fast on the rising edge of the clock signal, therefore the input clock is not within specification.

Accordingly, as is seen, a frequency monitor is provided that accurately determines if an input clock is within a specified frequency. To describe a preferred embodiment of a frequency monitored cell in accordance with the present invention, refer now to the following description with the accompanying figures.

Figure 3:
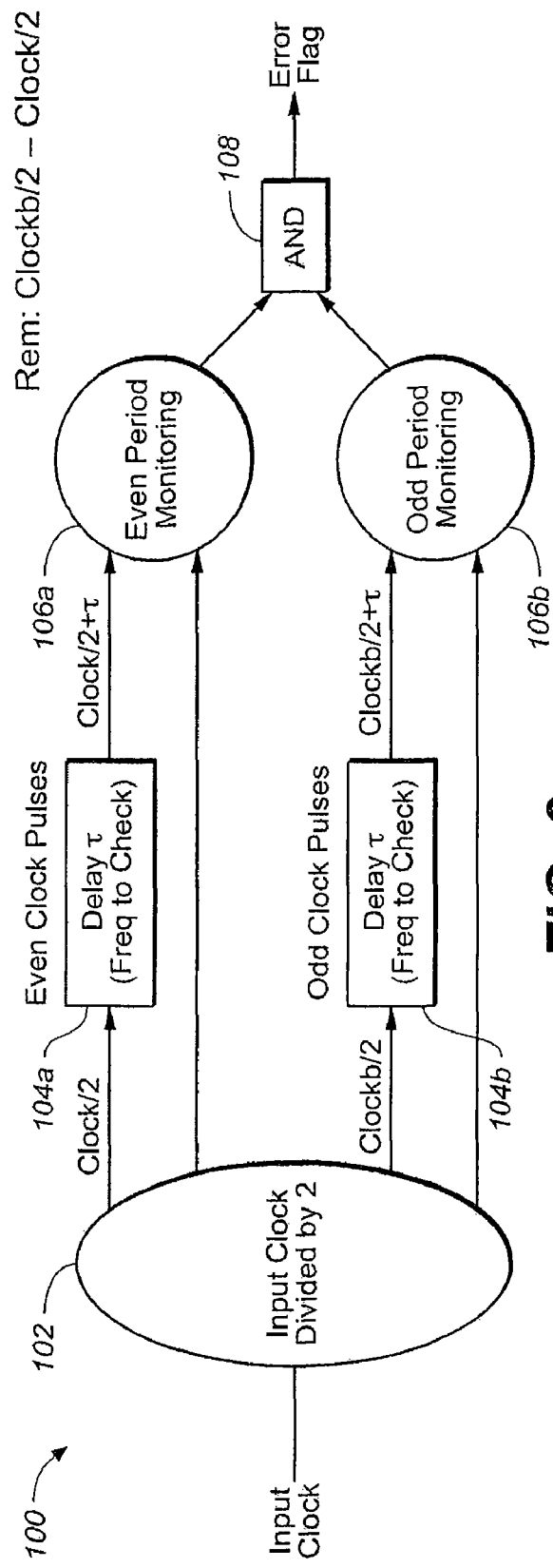
FIG. 3 is a functional diagram of an embodiment of a frequency cell monitor in accordance with the present invention.

FIG. 3 is a functional diagram of an embodiment of a frequency cell monitor 100 in accordance with the present invention. The monitor 100 includes a divider 102 on which separates the clock into even clock pulses and odd clock pulses. The even clock pulses are provided to delay 104a and the odd clock pulses are provided to delay 104b. To be fully independent of the input signal duty cycle, the input clock signal 102 is divided by two. In an embodiment the even and odd clock pulses are the even clock pulses derived from the input clock utilizing a divider-by-2 (D-latch).

These delayed odd and even pulses along with the input signals (clock 2A and clock 2B) are then provided to frequency period monitors. They are combined together via an AND mechanism 108 to provide an indication of the condition of the clock signal. To describe the operation of this the frequency monitor in more detail refer now to the following.

Figure 4:
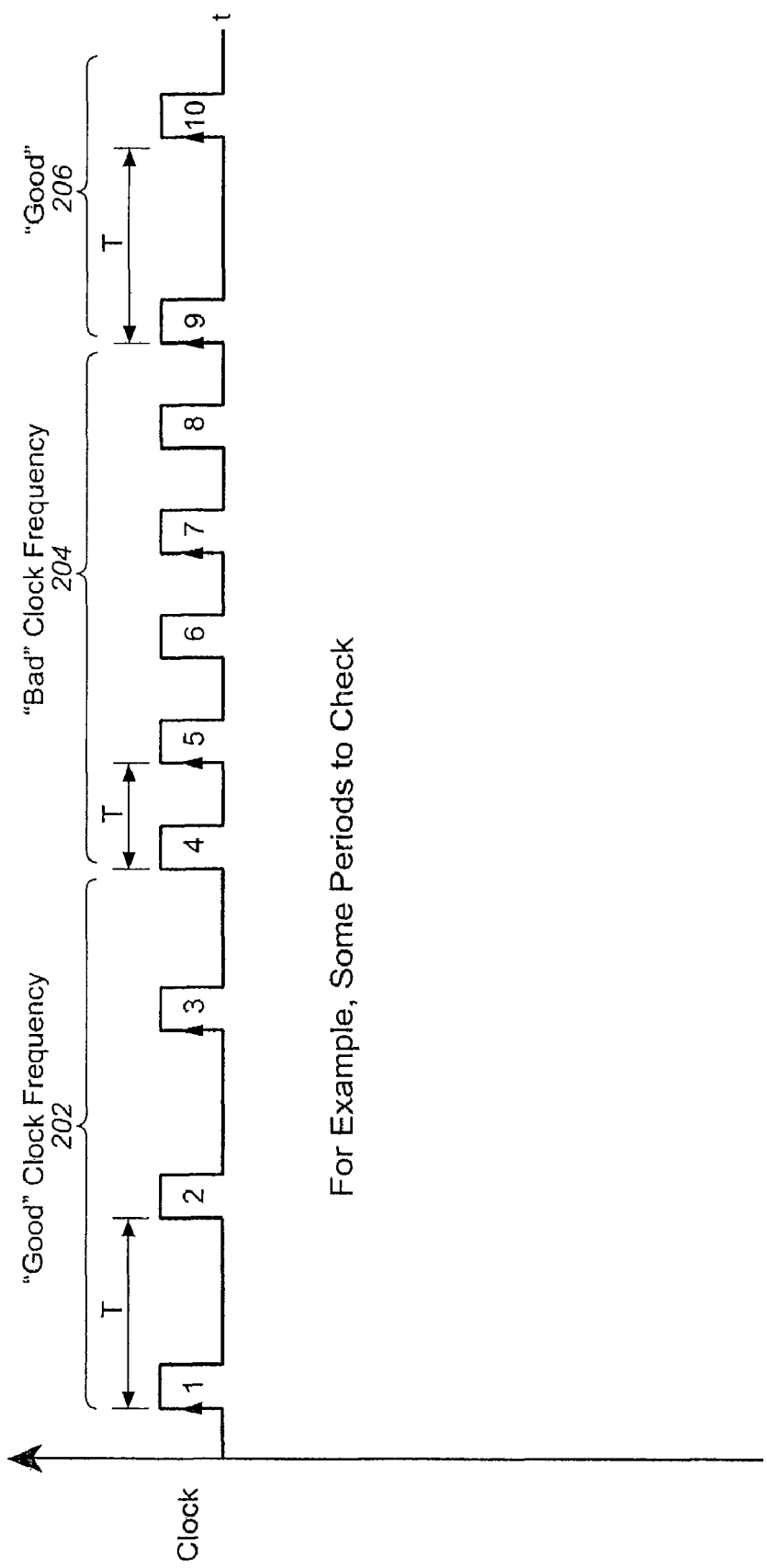
FIG. 4 is a timing diagram that illustrates an input clock signal in which the input clock is within specification.

FIG. 4 is a timing diagram that illustrates an input clock signal in which the input clock is within specification (period 202). Outside of the frequency range (period 204) and the input clock signal is back within specification (period 206).

The following examples illustrate providing an indication of the odd pulses as shown in FIG. 3. The corresponding indication is provided for the even pulses to provide the output signal indicative of the error flag.

Figure 5:
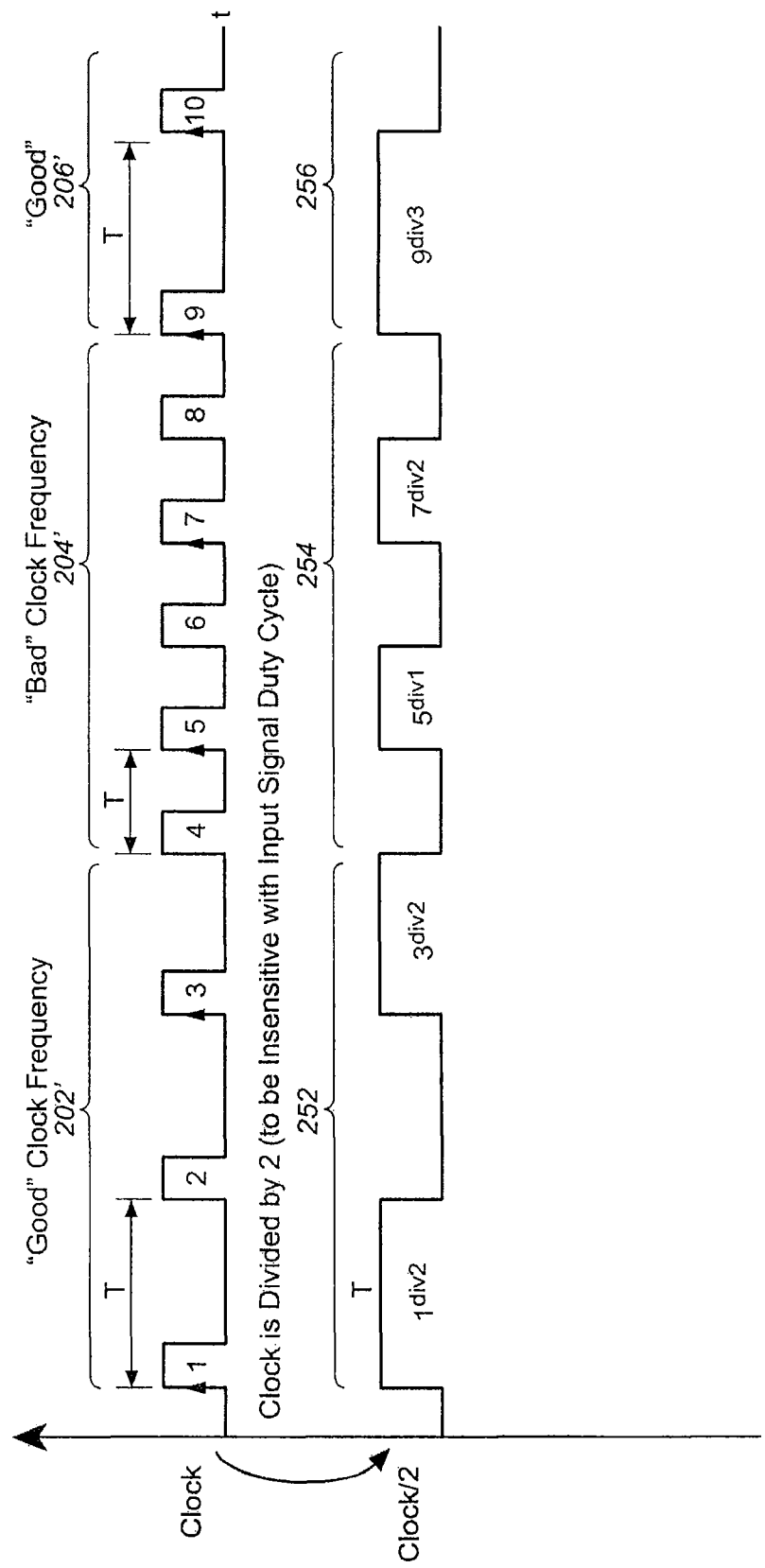
FIGS. 5-8 are timing diagrams that illustrate the operation of the frequency cell monitors of FIG. 3.
Figure 6:
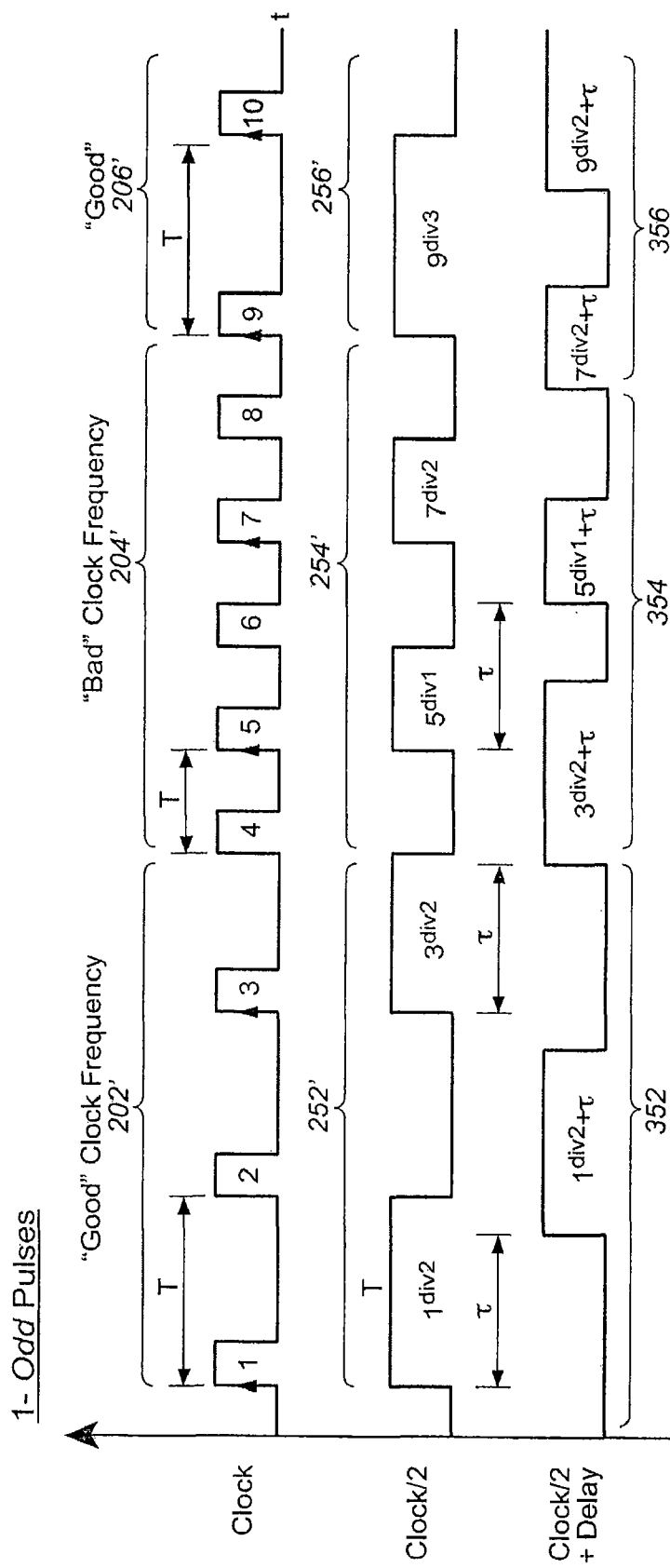
Figure 7:
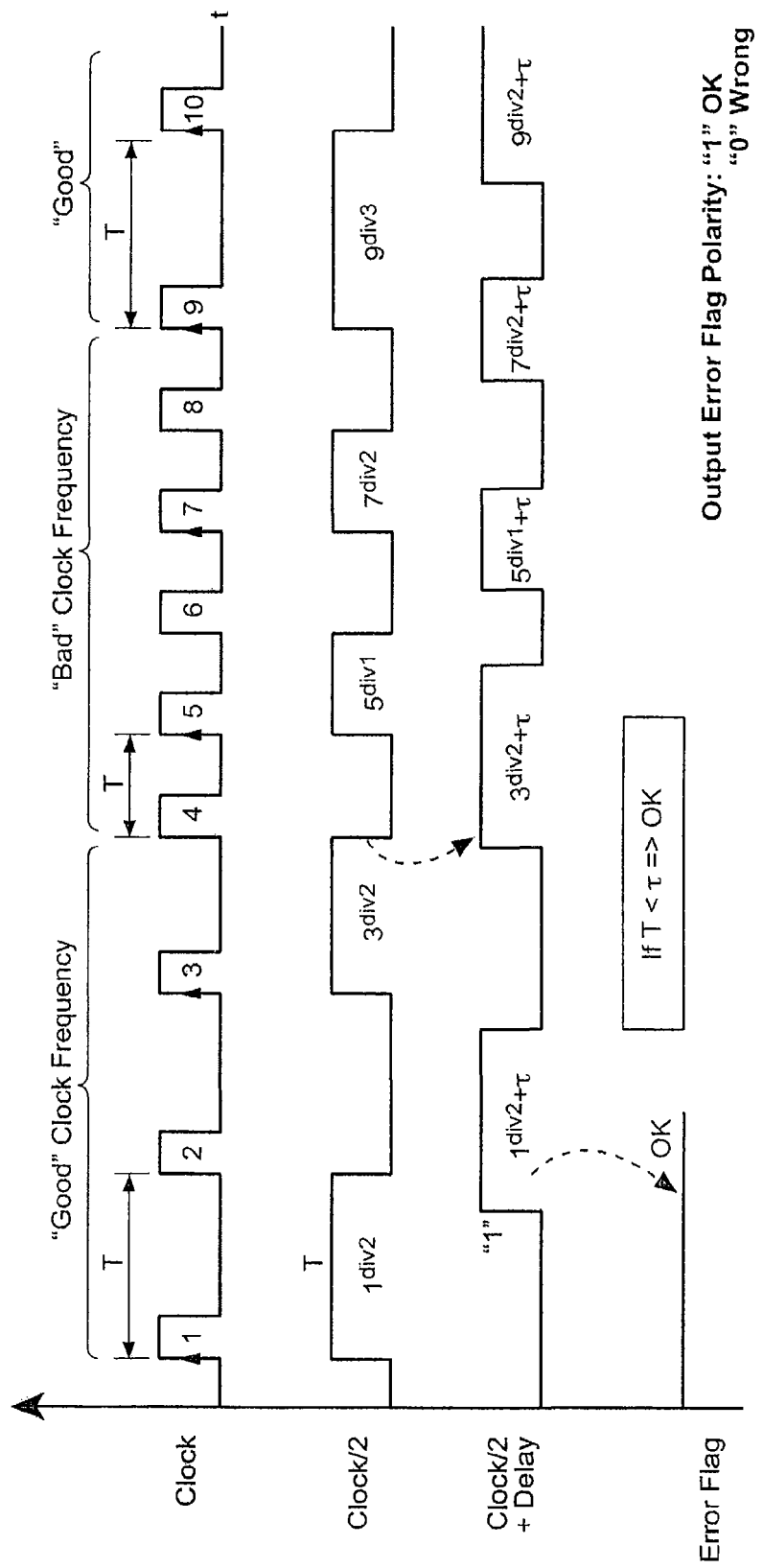
Figure 8:
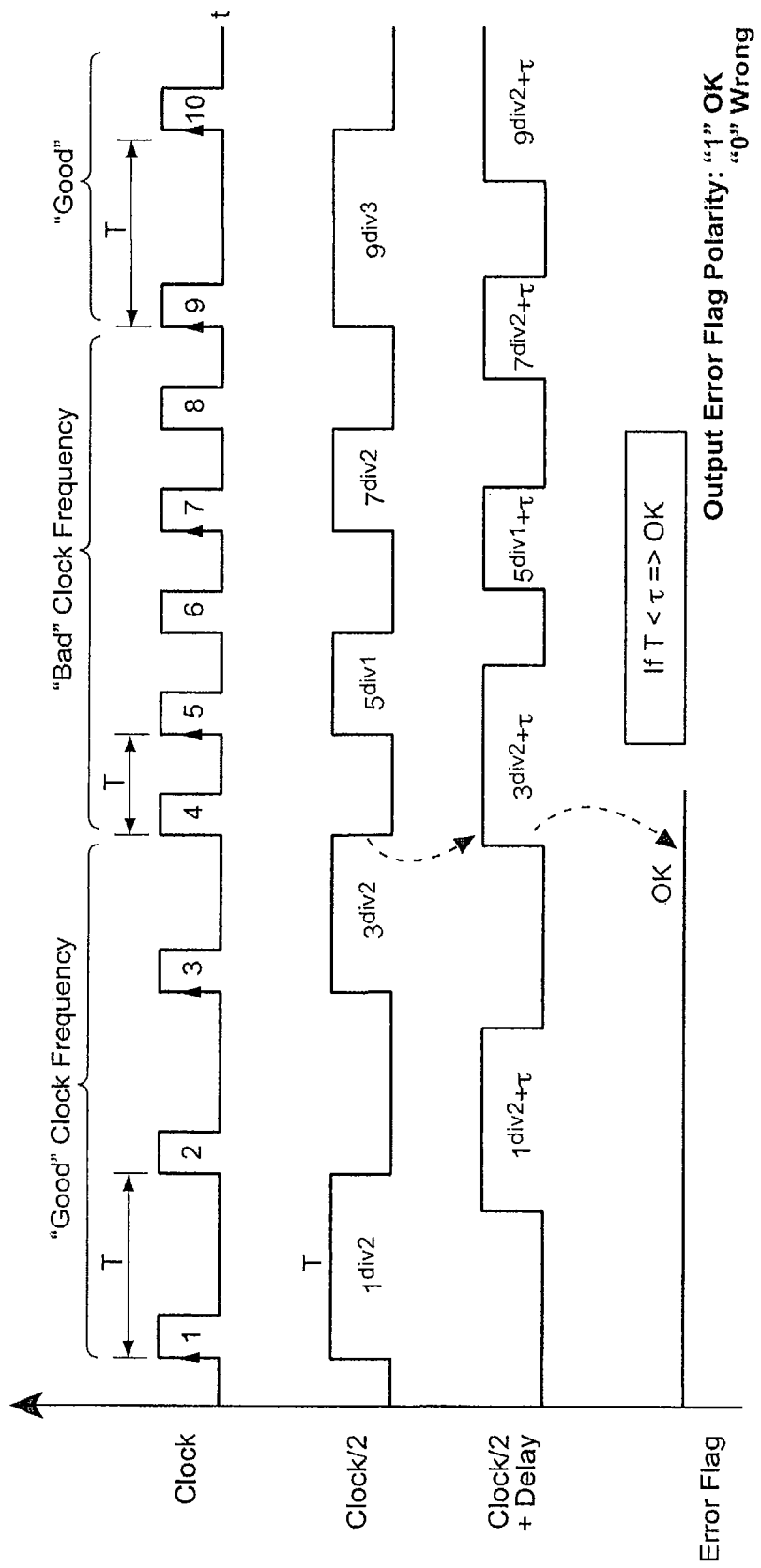

Accordingly, as is seen in FIG. 5, the clock signal is divided by 2 to provide a plurality of odd pulses, 252, 254 and 256, that include the delays. FIGS. 6, 7 and 8 are the same as FIG. 5 but the delayed clock/2 signal pulses 352, 354 and 356 (shown in FIG. 6) are provided. Accordingly if the period T is less than the delay then the error flag will be low indicating that the input clock signal is within the specified frequency range.

Figure 9:
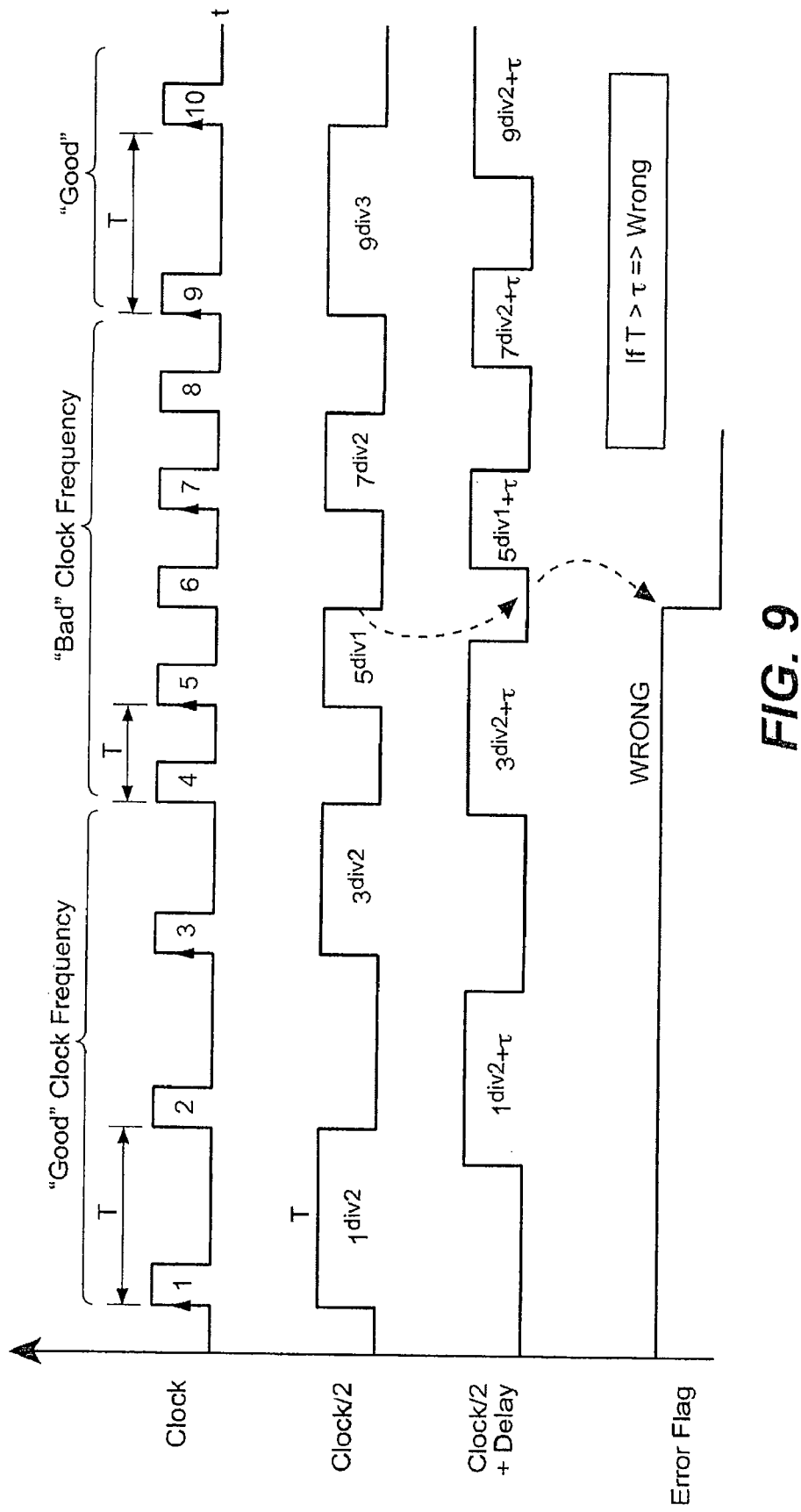
FIG. 9 is a timing diagram that illustrates the clock frequency is out of specification.
Figure 10:
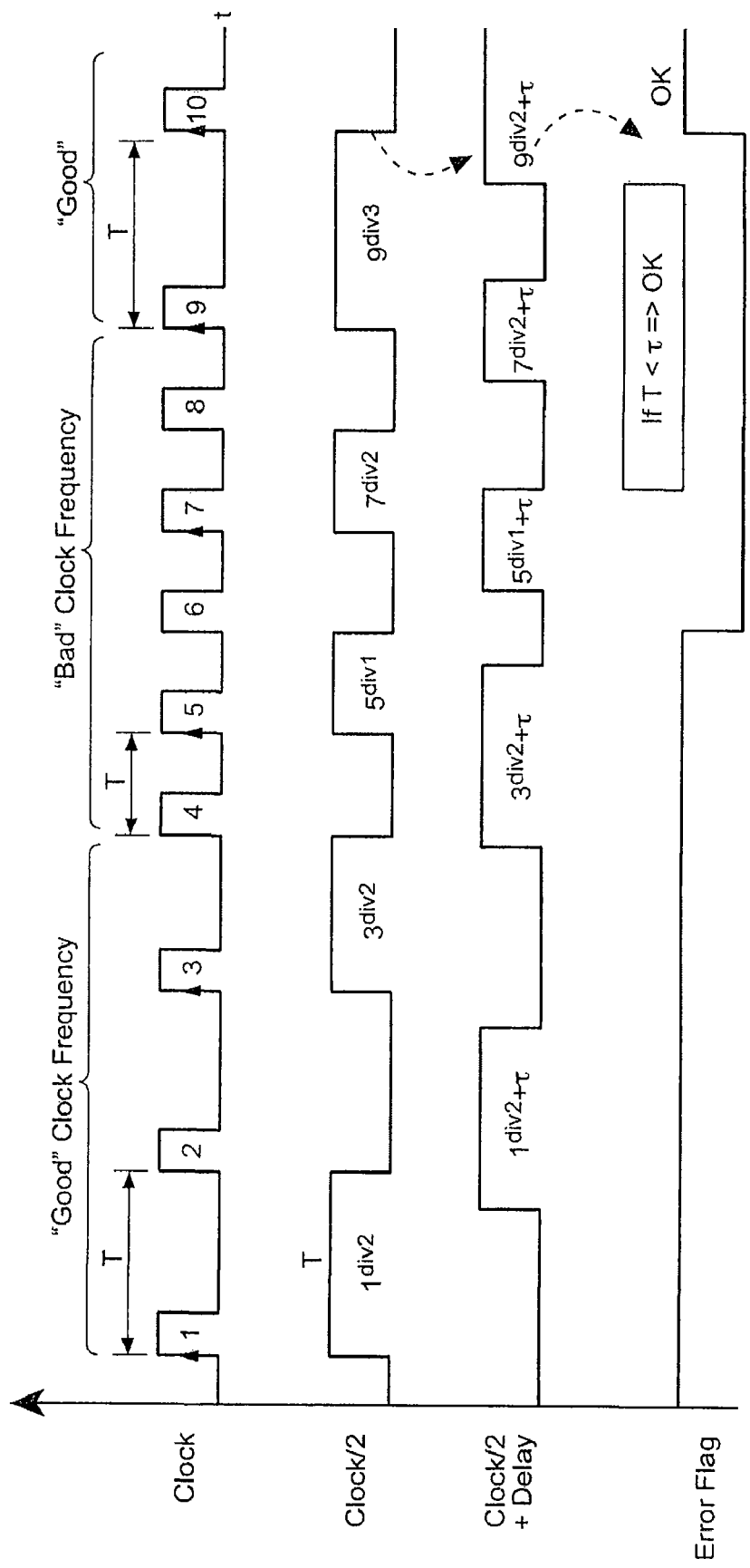
FIG. 10 is a timing diagram that illustrates the error flag indication is active when period is less than the delay indicating that the frequency of the input clock signal is within the specified frequency range.

FIG. 9 is a timing diagram that illustrates the input clock frequency being out of specification. As is seen in this figure, the period is greater than the delay indicating therefore the error flag is low. Finally, FIG. 10 is a timing diagram that illustrates the error flag indication is active when period is less than the delay indicating that the frequency of the input clock signal is within the specified frequency range.

Figure 11:
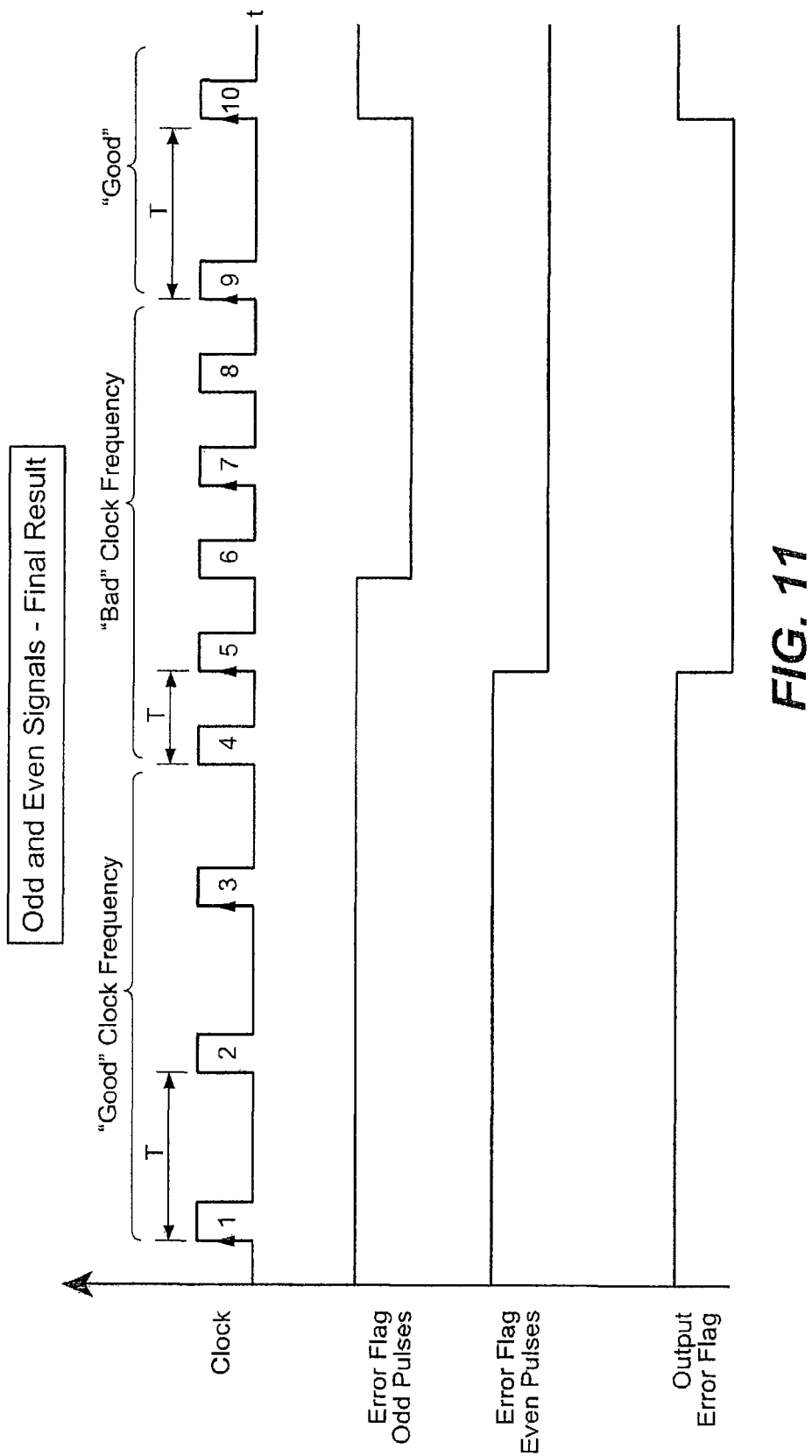
FIG. 11 is a timing diagram that illustrates the error flag indications for both even and odd pulses as well as the combined error flag indication.

FIG. 11 is a timing diagram that illustrates the error flag indications for both even and odd pulses as well as the combined error flag indication.

Figure 12A:
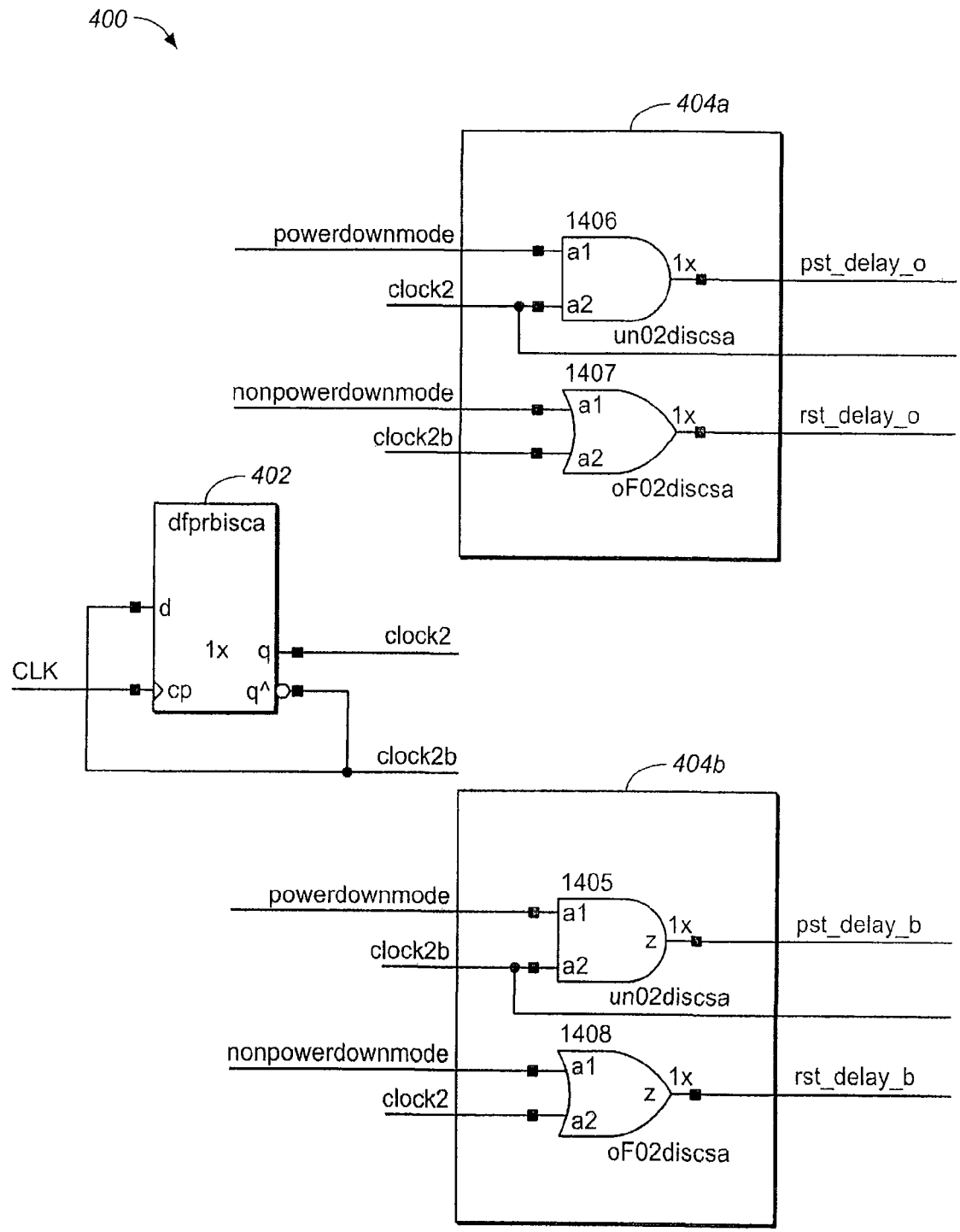
FIG. 12 is a diagram of an implementation of a frequency monitor cell in accordance with the present invention.
Figure 12B:
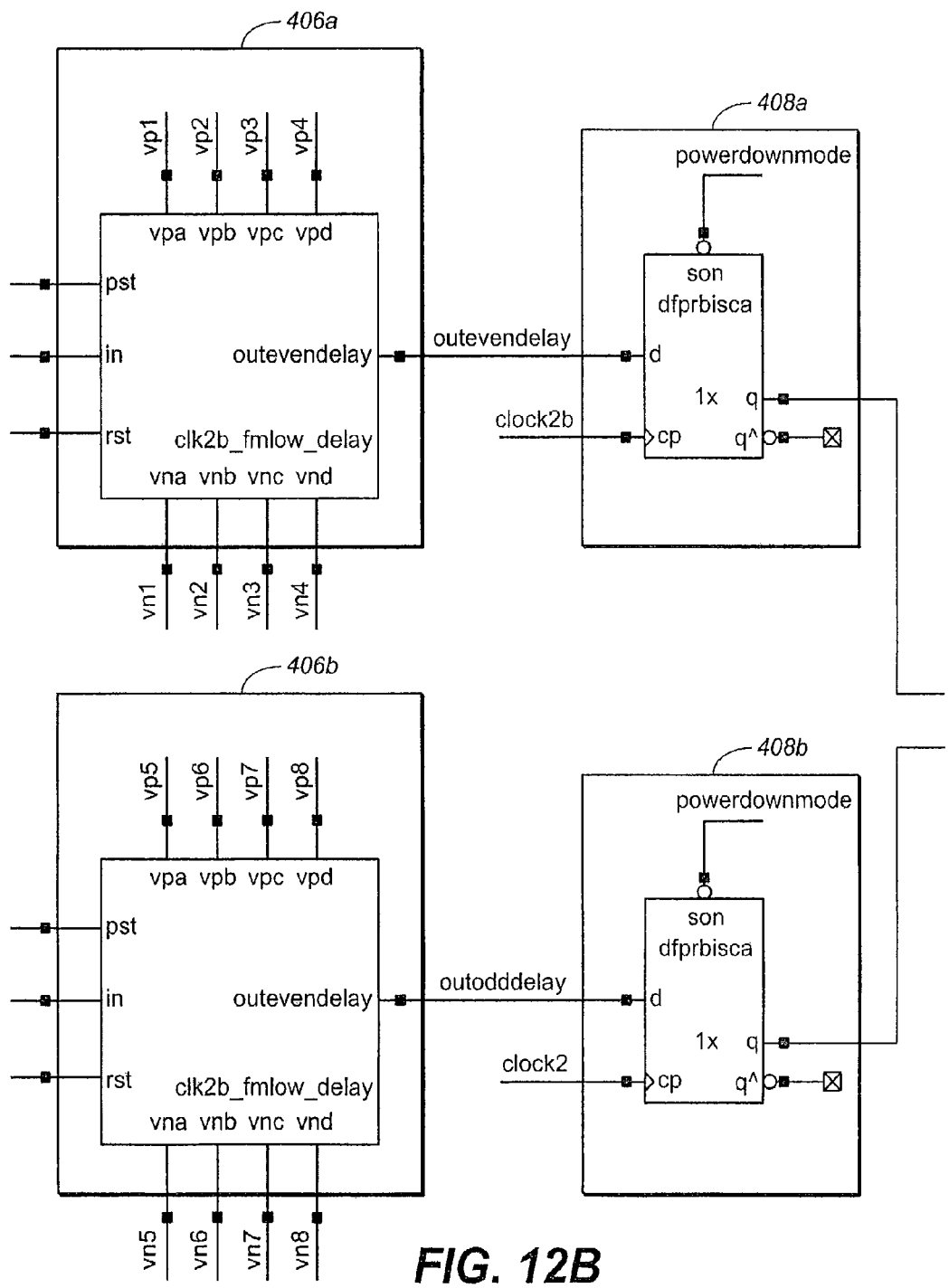
Figure 12C:
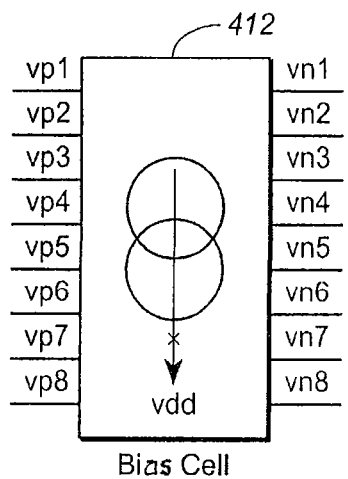
Figure 12C:
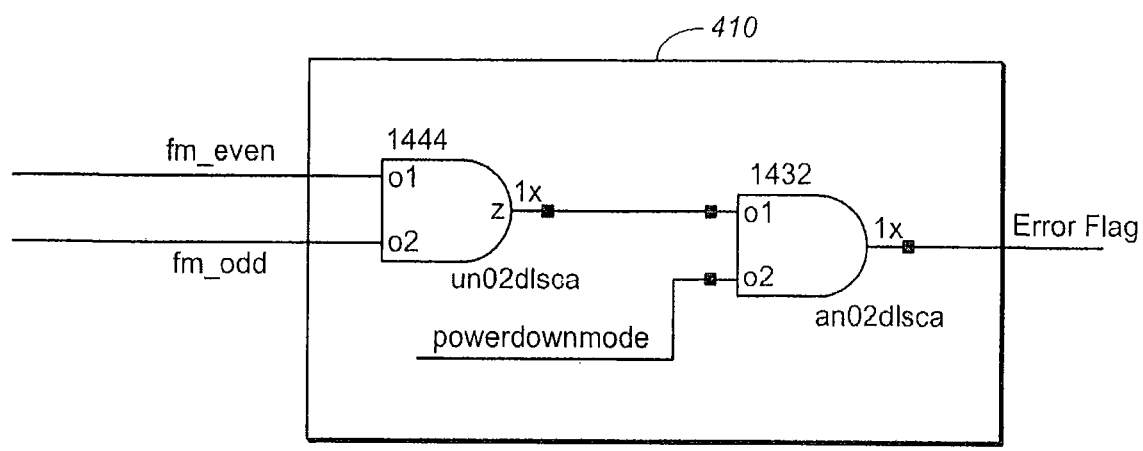
Figure 12:
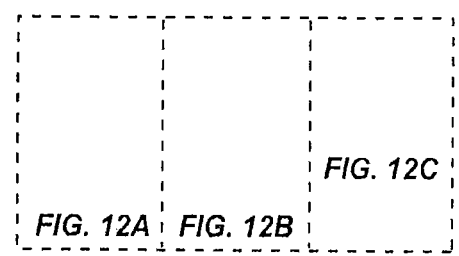

FIG. 12 is a diagram of an implementation of a frequency monitor cell 400 in accordance with the present invention. The cell 400 includes the following:

Control circuit 402, 404a and 404b. This control circuit (404a and 404b) divides the input clock signal into odd and even pulses and controls the clear signal.

Delay cells 406a and 406b. Delay cell 406a includes AND gate 1406 and OR gate 1407. Delay cell 406a includes an AND gate 1405 and a OR gate 1408. In one embodiment, the delays are provided by inverters controlled by current (bias), and loaded by capacitors. The spread of the frequency depends principally on the accuracy of the generated delay.

Check cells 408a and 408b verify if the clock signal (respectively odd and even signal) is within or not within the specification.

Bias cell 412. The bias cell 412 delivers a current reference (low voltage current bias).

Signal processing elements 410 including AND gates 1432 and 1444. The signal processing elements 410 are utilized to provide an indication that the input signal is within specification.

ADVANTAGES

The frequency monitor in accordance with the present invention provides good results in behavior and security performance, good behavior at high frequencies, and is insensitive to the input clock duty cycle. The frequency monitor in accordance with the present invention has low power consumption, and provides a simpler and more effective solution for determining whether an input clock signal is within specification. Finally, the frequency monitor in accordance with the present invention is adaptable to a variety of architectures.

Although the present invention has been described in accordance with the embodiments shown, one of ordinary skill in the art will readily recognize that there could be variations to the embodiments and those variations would be within the spirit and scope of the present invention. The frequency monitor in accordance with the present invention can be utilized in a variety of devices such as a microcontroller, digital signal processor or other types of integrated circuits. Accordingly, many modifications may be made by one of ordinary skill in the art without departing from the spirit and scope of the appended claims.

What is claimed is:

1. A method comprising:
   dividing a clock signal into a plurality of clock signal components;
   adding a delay to each of the clock signal components to provide delayed clock signal components;
   comparing the plurality of signal components with each of the delayed clock signal components to monitor whether clock signal within a predetermined frequency range; and
   providing an output signal indicative of a condition of the clock signal based upon the comparing step.

2. The method of claim 1 wherein the clock signal is divided into even pulses and odd pulses.

3. The method of claim 2 wherein comparing comprises comparing the odd pulses with the delayed odd pulses and by comparing the even pulses with the delayed even pulses.

4. The method of claim 1 wherein the condition comprises an indication of whether the clock signal is within a predetermined frequency range.

5. The method of claim 1 wherein the divided signal components are combined to provide the output signal indicative of the condition of the clock signal.

6. A frequency monitor comprising:
   a controller for receiving clock signal and dividing the clock signal into a plurality of clock pulses;
   a plurality of delays for receiving the plurality of clock pulses, and providing a plurality of delayed clock pulses;
   a plurality of monitors for receiving the plurality of delayed clock pulses, for receiving the plurality of clock pulses and for providing output signals indicative of a condition of the clock signal; and
   a combiner for receiving the output signals from the plurality of monitors and providing an error flag indicative of the condition of the clock signal.

7. The frequency monitor of claim 6 wherein the clock signal is divided into odd and even clock pulses.

8. The frequency monitor of claim 7 wherein the plurality of delays comprise first and second delays.

9. The frequency monitor of claim 8 wherein the plurality of monitors comprises first and second monitors.

10. The frequency monitor of claim 6 wherein the controller comprises a latch.

11. A frequency monitor circuit comprising:
    a control circuit for dividing an input clock signal into a plurality of clock signal components;
    a bias cell for providing a reference voltage;
    a delay cell system controlled by the bias cell, for receiving the divided clock signal and providing a plurality of divided delayed input clock signal components; and
    a signal processing system for receiving divided input clock signal components and the delayed divided input clock signal components to provide an indication of a condition of the input clock signal.

12. The frequency monitor of claim 11 wherein a plurality of input clock signal computer comprises even and odd pulses.

13. The frequency monitor of claim 11 wherein the delay cell system comprises first and second elements.

14. The frequency monitor of claim 13 wherein each of the delay elements include inverters which are coupled to capacitors.

15. A frequency monitor comprising:
   a controller for receiving the clock signal and dividing the signal into odd and even clock pulses;
   first and second delays for receiving the odd and even pulses, and providing a plurality of delayed odd and even clock pulses;
   first and second monitors for receiving the plurality of delayed odd and even clock pulses, for receiving the plurality of odd and even pulses and for providing output signals indicative of a condition of the clock signal; and
   a combiner for receiving the output signals and providing an error flag indicative of the condition of the clock signal.

16. The frequency monitor of claim 6 wherein the controller comprises a latch.

17. An integrated circuit comprising:
   a functional unit; and
   a frequency monitor coupled to the functional unit, the frequency monitor comprising a controller for receiving the clock signal and dividing the signal into a plurality of clock pulses; a plurality of delays for receiving the plurality of clock pulses, and providing a plurality of delayed clock pulses; a plurality of monitors for receiving the plurality of delayed clock pulses, for receiving the plurality of clock pulses and for providing output signals indicative of a condition of the clock signal; and a combiner for receiving the output signals from the plurality of monitors and providing an error flag indicative of the condition of the clock signal.

18. An apparatus comprising:
   a first circuit to divide a clock signal into a plurality of clock pulses;
   a second circuit to provide a plurality of delayed clock pulses based on the plurality of clock pulses; and
   a third circuit to provide an indication indicative of a condition of the clock signal based on the plurality of clock pulses and the plurality of delayed clock pulses.

* * * * *